(12) United States Patent
Shinagawa et al.

(10) Patent No.: US 8,552,549 B2
(45) Date of Patent: Oct. 8, 2013

(54) SEMICONDUCTOR DEVICE, AND INSPECTION METHOD THEREOF

(75) Inventors: Masatoshi Shinagawa, Shiga (JP); Takeshi Kawabata, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/404,116

(22) Filed: Feb. 24, 2012

(65) Prior Publication Data

US 2012/0161313 A1    Jun. 28, 2012

Related U.S. Application Data

(62) Division of application No. 11/585,928, filed on Oct. 25, 2006, now Pat. No. 8,148,810.

(30) Foreign Application Priority Data

Dec. 15, 2005   (JP) ................................ 2005-361132

(51) Int. Cl.
*H01L 23/053* (2006.01)

(52) U.S. Cl.
USPC ........................................................ 257/700

(58) Field of Classification Search
USPC ......... 257/700, 737, 778, 668, 787, 675, 724, 257/772, 779, E23.015, E23.068
See application file for complete search history.

(56) References Cited

U.S. PATENT DOCUMENTS

| | | | |
|---|---|---|---|
| 6,933,612 B2 | 8/2005 | Kimura | 257/778 |
| 7,030,639 B2 | 4/2006 | Ueminami et al. | |
| 2006/0001179 A1 | 1/2006 | Fukase et al. | 257/778 |

FOREIGN PATENT DOCUMENTS

| | | |
|---|---|---|
| JP | 9-223725 | 8/1997 |
| JP | 2002-083897 | 3/2002 |
| JP | 2002-237545 | 8/2002 |
| JP | 2004-247523 | 9/2004 |
| JP | 2004-281633 | 10/2004 |
| JP | 2004-363126 | 12/2004 |

*Primary Examiner* — Hoa B Trinh
(74) *Attorney, Agent, or Firm* — Panasonic Patent Center

(57) ABSTRACT

In a substrate for a stacking-type semiconductor device including a connection terminal provided for a connection with a semiconductor chip to be stacked and an external terminal connected to the connection terminal through a conductor provided in a substrate, connection terminals of a power supply, a ground and the like, which terminals have an identical node, are electrically continuous with each other. Thus, it is possible to facilitate an inspection of electrical continuity between each connection terminal and an external terminal corresponding to each connection terminal by minimum addition of inspecting terminals. Further, it is possible to improve reliability of a stacking-type semiconductor module.

21 Claims, 6 Drawing Sheets

SEMICONDUCTOR DEVICE, AND INSPECTION METHOD THEREOF

Figure 1:
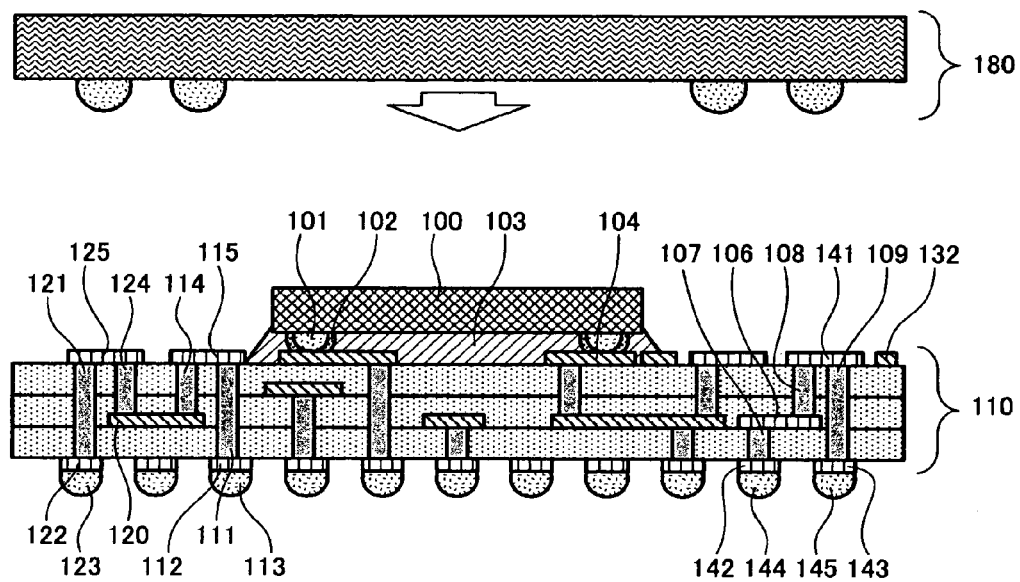

BACKGROUND OF THE INVENTION (1) Field of the Invention

The present invention relates to a semiconductor device having another semiconductor device stacked thereon, and an inspection method of the semiconductor device.

(2) Description of the Related Art

In response to demand for small-sized, high-performance electronic apparatuses such as portable telephones and digital cameras, there is developed a stacking-type semiconductor module including electronic components, in particular, semiconductor chips integrated with each other in a stacked manner (refer to JP2004-363126A).

For example, a second semiconductor package containing a second semiconductor chip is stacked on a first semiconductor package containing a first semiconductor chip.

Such a stacking-type semiconductor module is subjected to an inspection after the aforementioned stacking process. Herein, a stacking-type semiconductor module evaluated as a defective is discarded. Alternatively, in the stacking-type semiconductor module evaluated as a defective, stacked packages must be disassembled from each other once and, then, must be assembled again. This leads to deterioration in yield.

In contrast, JP2004-281633A discloses a stacking-type module including a plurality of stacked chips. In the stacking-type module, each chip includes a mounting terminal used when the chip is mounted on a first single plane perpendicular to a stacking direction, and an inspecting terminal used when the stacking-type module is subjected to an inspection of quality. Each chip also includes a mounting pad connected to a mounting terminal of another chip adjacent to the chip on a second single plane different from the first single plane, and an inspecting pad electrically continuous with the inspecting terminal.

According to the aforementioned technique, first, an inspecting pad of amounted chip is joined to an inspecting terminal of a chip to be stacked, and an inspection is performed in such a manner that an inspecting signal is input through an inspecting terminal, which is electrically continuous with the inspecting pad, of the mounted chip. Thereafter, if a result of the inspection is good, the chip to be stacked is allowed to move on a single plane on which the chip is mounted, and a mounting terminal of the chip to be stacked is connected to a mounting pad of the mounted chip.

Further, JP2002-83897A discloses a stacking-type semiconductor module readily subjected to an inspection of an electrical property. This module includes: a semiconductor chip; a substrate having a wiring pattern formed thereon, having the semiconductor chip mounted on one of faces thereof, and having an outer dimension larger than that of the semiconductor chip; a first terminal formed at a region, located outside a region where the semiconductor chip is mounted, in the substrate; and a second terminal partially containing the wiring pattern, and having a bared face opposite to a face opposing the semiconductor chip at a region located inside the region where the first terminal is formed in the substrate. Herein, the semiconductor chip is electrically connected to the first and second terminals.

In this semiconductor device, first and second terminals are electrically connected to a semiconductor chip, respectively. Thus, the first terminal can be used for an electrical connection with another member and the second terminal can be used for an inspection of an electrical property.

In addition, JP09-223725A discloses a semiconductor package of a grid array type. According to this semiconductor package, it is possible to readily perform an inspection of continuity between signal pins and a circuit pattern of a circuit board in a case that the semiconductor package is surface-mounted on the circuit board, and to readily perform an electrical test for the semiconductor package after completion of manufacturing. In the semiconductor package, a semiconductor device is surface-mounted on a circuit board in such a manner that signal pins are arranged on a bottom face thereof in form of a grid array and are joined to a circuit pattern of the circuit board. The semiconductor device includes a contact pad formed on a top face thereof and electrically connected to each signal pin.

According to the technique disclosed in JP2004-281633A, each chip to be stacked includes amounting connection terminal and an inspecting connection terminal, and a substrate having each chip mounted thereon includes an inspecting joint and a mounting terminal used for a connection with another substrate. However, this stacking-type module has a configuration that the chip is directly mounted on the substrate. Consequently, a package in which a chip is mounted on a sub-substrate cannot be subjected to an inspection.

According to the technique disclosed in JP2002-83897A, an inspection can be performed by means of a second terminal. However, a connection terminal used for stacking cannot be subjected to an inspection.

According to the technique disclosed in JP09-223725A, an inspection of continuity can be performed by means of a signal pin and a contact pad. However, if this technique is applied to a stacking-type semiconductor module, a contact pad to be used as a stacking connection terminal is damaged due to contact with a probe. Consequently, connection failure readily occurs.

On the other hand, as an electronic apparatus is reduced in size and thickness and a semiconductor chip is reduced in thickness, there is increasingly demanded enhancement in function in such a manner that semiconductor chips are stacked. In addition, a semiconductor device having semiconductor chips stacked thereon is realized as follows. That is, there are prepared a plurality of semiconductor chips to be stacked, and semiconductor chips to be mounted are selected in accordance with application. In this case, a semiconductor device to be stacked must be subjected to an inspection of a connection status between terminals in order to secure reliability before semiconductor chips are stacked on the semiconductor device. For example, in an inspection of interconnection in a semiconductor device before stacking, it is necessary to inspect a status of electrical continuity between a connection terminal provided for a connection with a semiconductor device to be mounted on the semiconductor device and a bump electrode provided for a connection with an external apparatus. In this inspection method, a probe is used as disclosed in JP09-223725A. In this method, however, a contact pad is damaged as described above, so that connection failure readily occurs. Further, a tester to be used herein is expensive.

SUMMARY OF THE INVENTION

A semiconductor device and an inspection method thereof according to the present invention are devised in order to solve the aforementioned problems. An object of the present invention is to facilitate an inspection of electrical continuity between a connection terminal provided for a connection with a semiconductor device to be stacked on a semiconductor device and a bump electrode provided for a connection with an external apparatus, and to improve reliability of a stacking-type semiconductor module.

In order to accomplish this object, the present invention provides a semiconductor device comprising a substrate having a semiconductor chip mounted thereon, and at least one stacking-type semiconductor chip to be stacked on the substrate. The semiconductor device further comprises: a plurality of connection terminals each provided for connection with a terminal of the stacking-type semiconductor chip, the terminals being formed on a stacking-type semiconductor chip mounting face of the substrate; a plurality of external electrodes each formed on a face opposite to the stacking-type semiconductor chip mounting face of the substrate; a conductor directly connecting, in the substrate, between one of the connection terminal and an internal wire of the substrate and the external electrode; and an inspecting external electrode connected to the connection terminal connected to the external electrode, the electrode being formed on the face opposite to the stacking-type semiconductor chip mounting face of the substrate. Herein, by performing an inspection of continuity between the external electrode connected to the connection terminal and the inspecting external electrode, an inspection of continuity between each connection terminal and each external electrode is performed.

The present invention also provides semiconductor device comprising a substrate having a semiconductor chip mounted thereon, and at least one stacking-type semiconductor chip to be stacked on the substrate. The semiconductor device further comprises: a plurality of connection terminals each provided for a connection with a terminal of the stacking-type semiconductor chip, the terminals being formed on a stacking-type semiconductor chip mounting face of the substrate; a plurality of external electrodes each formed on a face opposite to the stacking-type semiconductor chip mounting face of the substrate; a conductor directly connecting, in the substrate, between one of the connection terminal and an internal wire of the substrate and the external electrode; and a conductive structure establishing a serial connection between at least two external electrodes from among the plurality of external electrodes and having an identical node. Herein, by performing an inspection of continuity between external electrodes to be connected to predetermined two connection terminals selected from the plurality of connection terminals connected in series, an inspection of continuity between each connection terminal and each external electrode is performed.

In the semiconductor device according to the present invention, the conductive structure is comprised of a wire on an uppermost layer of the substrate on which the connection terminal is formed. An external electrode connected to an optional connection terminal selected from the plurality of connection terminals connected in series is set as a reference electrode. By performing an inspection of continuity between the reference electrode and each of the external electrodes, an inspection of continuity between each connection terminal and each external electrode is performed.

In the semiconductor device according to the present invention, the conductive structure is comprised of an annular wire formed on the uppermost layer of the substrate and suppressing voltage fluctuations, and an external electrode having a node identical to that of the annular wire is connected to the annular wire.

In the semiconductor device according to the present invention, the conductive structure is comprised of a combination of wires formed on optional layers of the substrate. By performing an inspection of continuity between external electrodes connected to predetermined two connection terminals selected from the connection terminals connected in series, an inspection of continuity between each connection terminal and each external electrode is performed.

The present invention also provides a semiconductor device comprising a substrate having a semiconductor chip mounted thereon, and at least one stacking-type semiconductor chip to be stacked on the substrate. The semiconductor device further comprises: a plurality of connection terminals each provided for a connection with a terminal of the stacking-type semiconductor chip, the terminals being formed on a stacking-type semiconductor chip mounting face of the substrate; a plurality of external electrodes each formed on a face opposite to the stacking-type semiconductor chip mounting face of the substrate; a conductor directly connecting, in the substrate, between one of the connection terminal and an internal wires of the substrate and the external electrode; and a conductive structure establishing a serial connection between two external electrodes having an identical node and making a pair. Herein, by performing an inspection of continuity between the two external electrodes to be connected to connection terminals in the respective pairs connected in series, an inspection of continuity between each connection terminal and each external electrode is performed.

The semiconductor device according to the present invention further comprises an annular wire formed of a wire on an uppermost layer of the substrate and connected to anyone of the connection terminals in the respective pairs, thereby to suppress voltage fluctuations.

In the semiconductor device according to the present invention, a space between the conductor and the conductive structure has a designed dimensional value larger than a minimum designed dimensional value.

The present invention also provides an inspection method of a semiconductor device. Herein, in order for performing an inspection of continuity for the aforementioned semiconductor device, inspection sockets electrically connect the separated external electrodes of the respective pairs such that all connection terminals having an identical node are connected in series. By performing an inspection of continuity between the terminals of the inspection sockets connected to the external electrodes located at both ends of the serial connection, an inspection of continuity between each connection terminal and each external electrode is performed.

In the inspection method of a semiconductor device according to the present invention, the inspection sockets are used to electrically connect the separated external electrodes of the respective pairs such that all connection terminals are connected in series. By performing an inspection of continuity between the terminals of the inspection sockets connected to the external electrodes located at both ends of the serial connection, inspections of continuity between all the connection terminals and the external electrodes are performed.

According to the present invention, it is possible to facilitate an inspection of electrical continuity between a connection terminal provided for a connection with a semiconductor device to be stacked on a semiconductor device and a bump electrode provided for a connection with an external apparatus, and to improve reliability of a stacking-type semiconductor module.

BRIEF DESCRIPTION OF THE INVENTION

Figure 2:
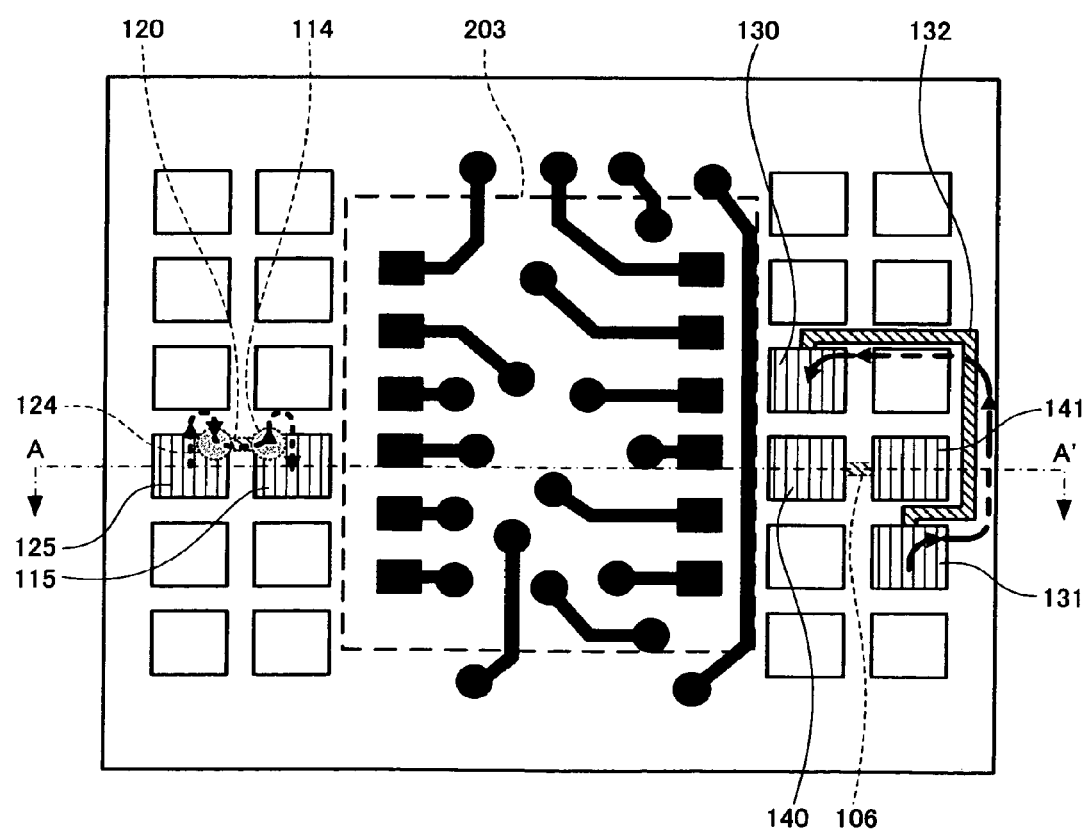
Figure 3:
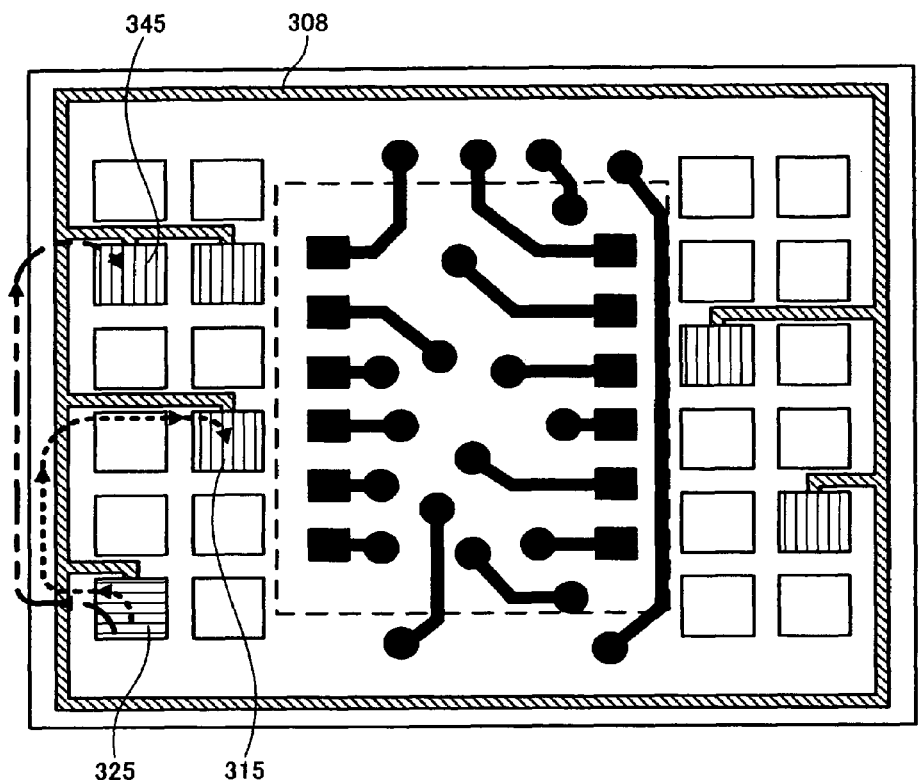
Figure 4:
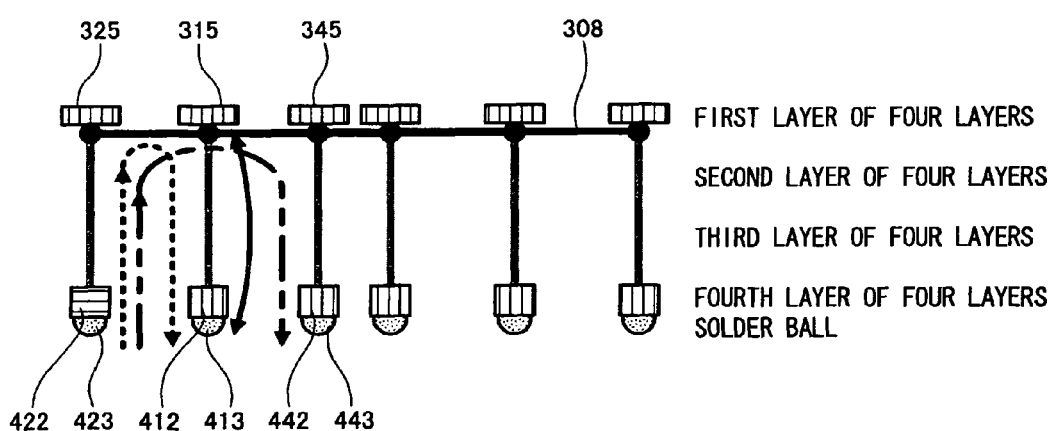
Figure 5:
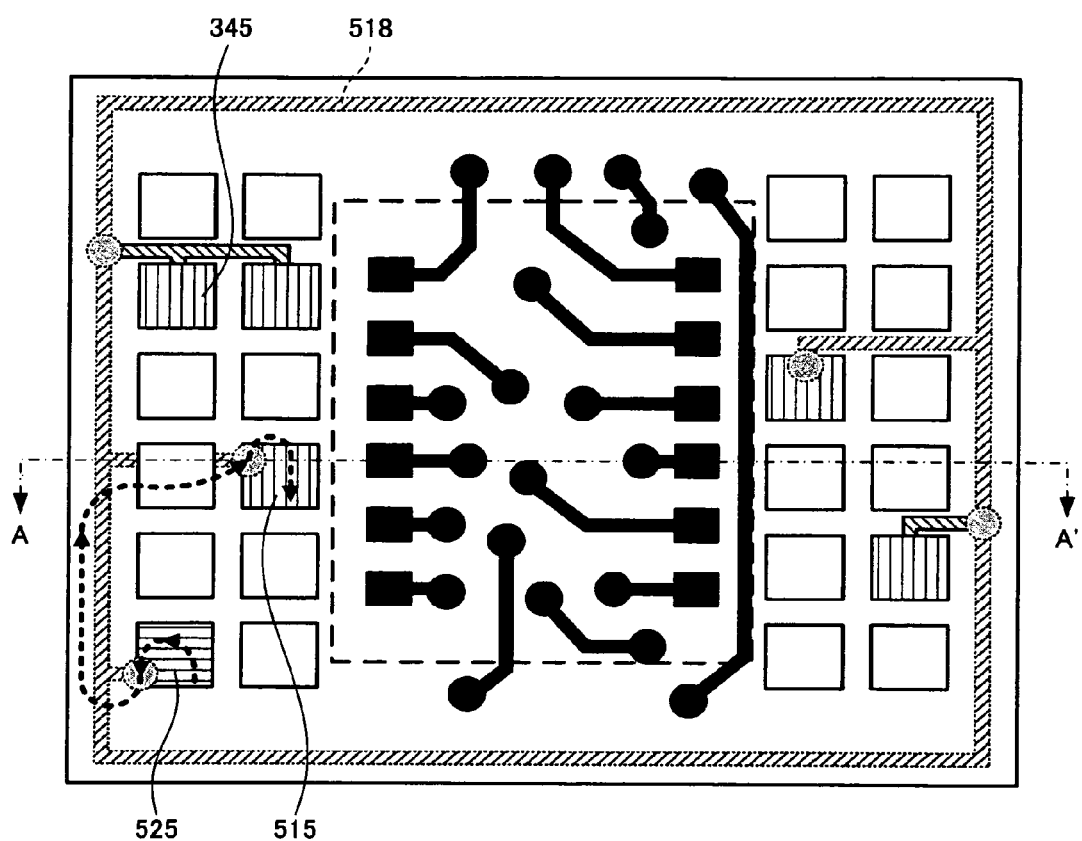
Figure 6:
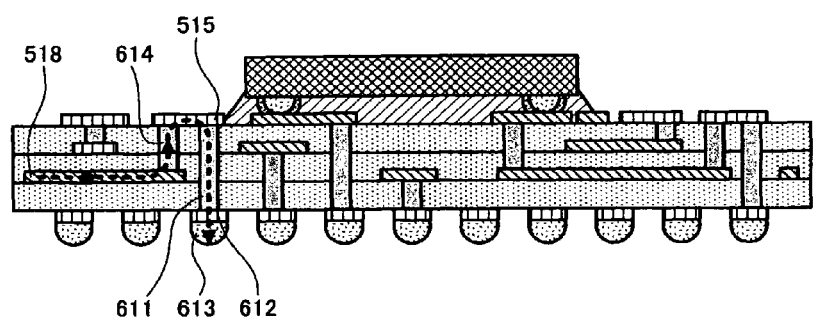
Figure 7:
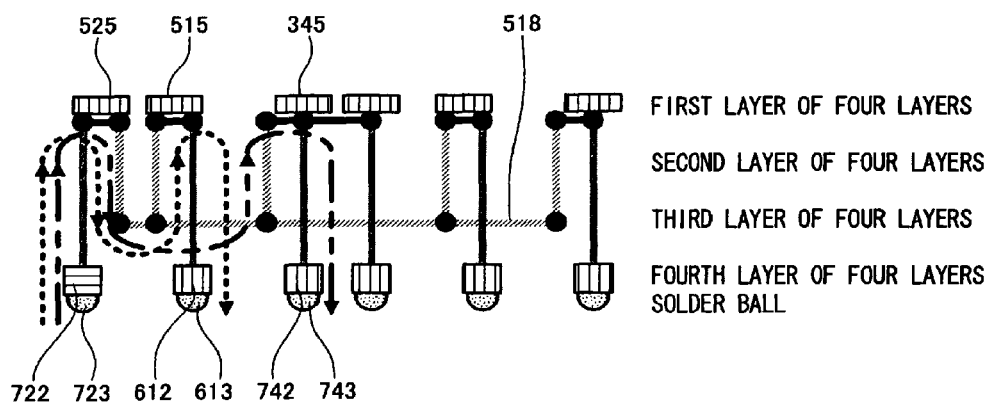
Figure 8:
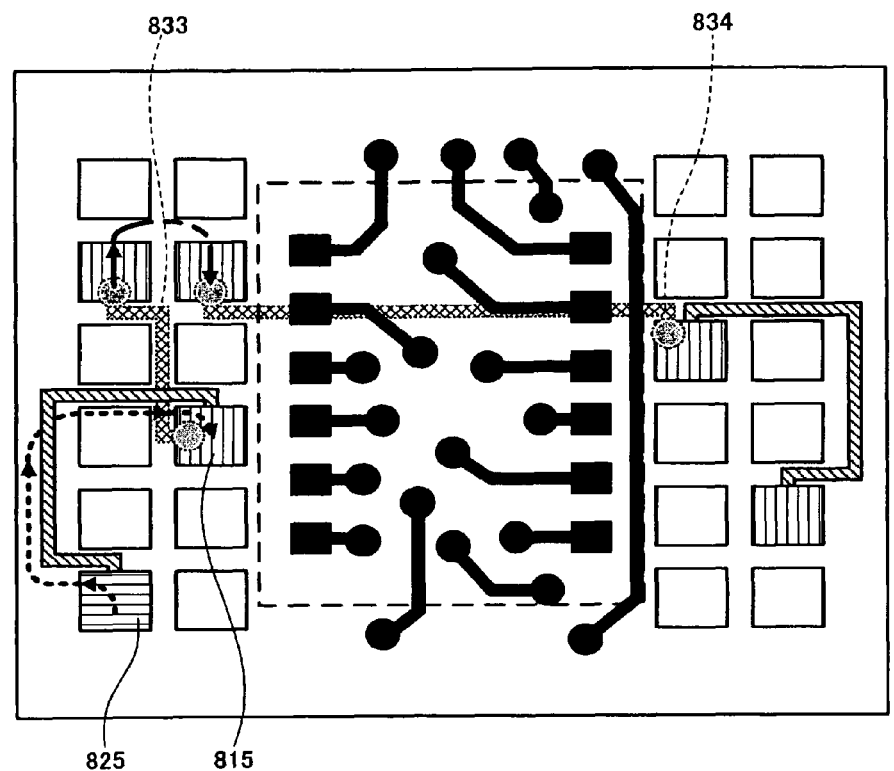
Figure 9:
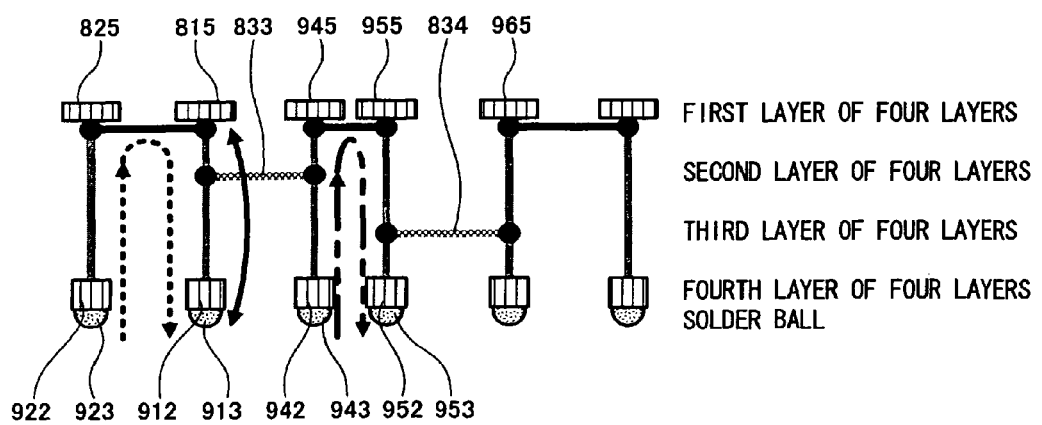
Figure 10:
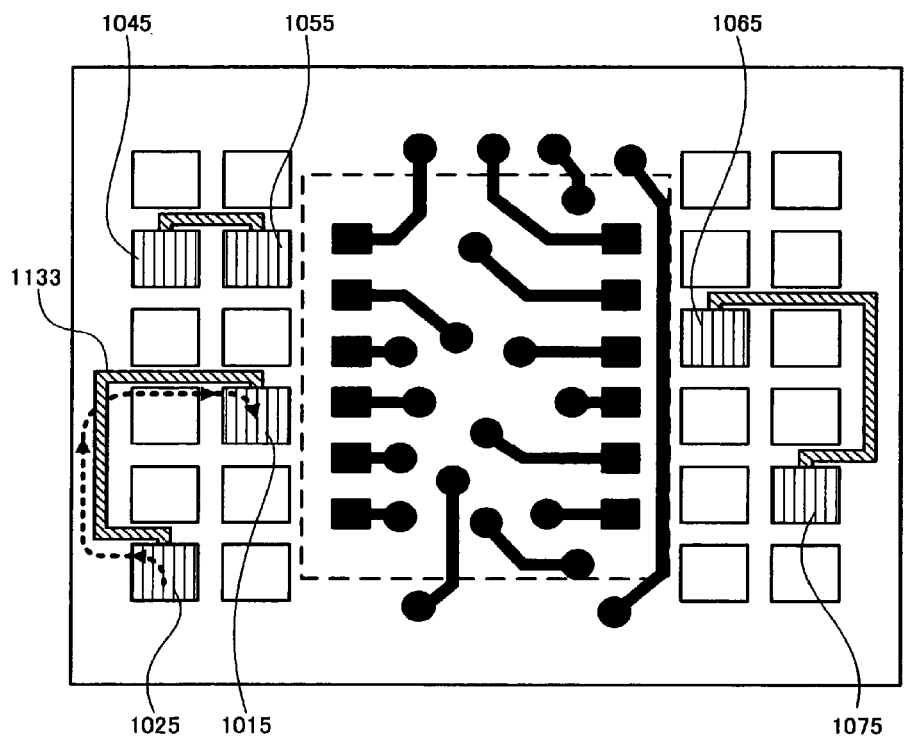
Figure 11:
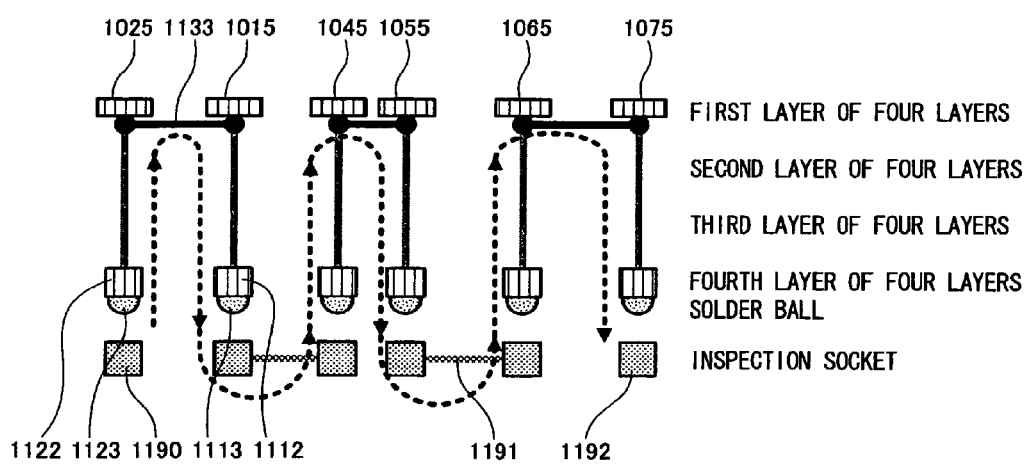

FIG. 1 is a sectional view illustrating a configuration of a stacking-type semiconductor device in a first embodiment of the present invention;

FIG. 2 briefly illustrates a configuration of a substrate in the first embodiment of the present invention when being seen from above;

FIG. 3 briefly illustrates a configuration of a substrate in a second embodiment of the present invention when being seen from above;

FIG. 4 schematically illustrates a configuration of a connection in the second embodiment of the present invention;

FIG. 5 briefly illustrates a configuration of a substrate in a third embodiment of the present invention when being seen from above;

FIG. 6 is a sectional view illustrating the configuration of the substrate in the third embodiment of the present invention;

FIG. 7 schematically illustrates a configuration of a connection in the third embodiment of the present invention;

FIG. 8 briefly illustrates a configuration of a substrate in a fourth embodiment of the present invention when being seen from above;

FIG. 9 schematically illustrates a configuration of a connection in the fourth embodiment of the present invention;

FIG. 10 briefly illustrates a configuration of a substrate in a fifth embodiment of the present invention when being seen from above; and FIG. 11 schematically illustrates a configuration of a connection in the fifth embodiment of the present invention.

DESCRIPTION OF THE PREFERRED EMBODIMENTS

Hereinafter, description will be given of preferred embodiments of the present invention with reference to the drawings. In the drawings, identical components are denoted by identical reference numerals; therefore, duplicate description thereof will not be given in some cases. Further, the respective components illustrated in the drawings are different in thickness, length and the like from actual components in view of creation of the drawings. In addition, connecting electrodes of a semiconductor chip, and connection terminals, wiring patterns, vias and the like of a substrate are not illustrated or are illustrated while counts and shapes thereof are appropriately changed.

The present invention provides a semiconductor device, and an inspection method thereof. The semiconductor device includes a semiconductor chip and a substrate having the semiconductor chip mounted thereon. The semiconductor device further includes an external terminal formed on a face opposing a face where the semiconductor chip is mounted, and a connection terminal provided for a connection with a stacking-type semiconductor chip to be formed on the semiconductor chip mounting face. Herein, an inspecting external terminal to be electrically connected to the connection terminal is provided on the external terminal formed face; thus, the connection terminal is connected to two external terminals, that is, amounting external terminal and an inspecting external terminal. A status of electrical continuity between the external terminal and the inspecting external terminal is checked; thus, an inspection of continuity between the connection terminal and the external terminal is performed. With this configuration, an inspection of continuity is performed by contact only with an external terminal and an inspecting external terminal each formed on one of faces of a substrate. Therefore, it is possible to facilitate an inspection of electrical continuity between a connection terminal and an external terminal, and to improve reliability of a stacking-type semiconductor module.

In a case that a plurality connection terminals have an identical node such as a power supply or a ground, theses connection terminals are connected in series. Then, an inspection of continuity between external electrodes corresponding to two connection terminals selected from the plurality of connection terminals connected in series is performed without provision of an inspecting external terminal. Thus, it is possible to perform an inspection of electrical continuity between a connection terminal and an external electrode.

Hereinafter, specific description will be mainly given of a semiconductor device in a case that a plurality of connection terminals have an identical node, and an inspection method thereof.

(First Embodiment)

With reference to FIGS. 1 and 2, description will be given of a semiconductor integrated circuit in a first embodiment of the present invention.

FIG. 1 is a sectional view taken along a line A-A' in FIG. 2 and illustrates a configuration of a stacking-type semiconductor device in the first embodiment of the present invention. FIG. 2 briefly illustrates a configuration of a substrate in the first embodiment of the present invention when being seen from above.

In FIG. 1, a semiconductor device 180 is stacked on a substrate 110 having a semiconductor chip 100 mounted thereon. A bump electrode 101 connects between the semiconductor chip 100 and the substrate 110. The bump electrode 101 is bonded to the substrate 110 through a conductive adhesive 102. A space between the semiconductor chip 100 and the substrate 110 is filled with an underfill resin 103. In the first embodiment and subsequent embodiments, the semiconductor chip 100 is mounted on the substrate 110 in a typical flip-chip manner. However, a mounting method of a semiconductor chip is not particularly limited thereto. For example, a semiconductor chip may be mounted on a substrate in a wire bonding manner. Alternatively, a plurality of stacked semiconductor chips may be mounted on a substrate.

Next, description will be given of the configuration of the substrate 110.

Connection terminals 115, 125 and 141 connect between the semiconductor device 180 to be stacked and the substrate 110. Wires 104 and 132 are formed on a first layer (a top face) of the substrate 110. Wires 106 and 120 are formed on a third layer of the substrate 110. Connection terminals 112, 122, 142 and 143 are formed on a fourth layer (a bottom face) of the substrate 110. Bump electrodes 113, 123, 144 and 145 serve as an external electrode, respectively. A conductor 107 connects between the wire 106 and the connection terminal 142. A conductor 108 connects between the wire 106 and the connection terminal 141. A conductor 109 connects between the connection terminal 141 and the connection terminal 143. A conductor 111 connects between the connection terminal 112 and the connection terminal 115. A conductor 114 connects between the connection terminal 115 and the wire 120. A conductor 121 connects between the connection terminal 122 and the connection terminal 125. A conductor 124 connects between the connection terminal 125 and the wire 120.

The substrate 110 has a structure that interconnection by conductive structures such as the wire 104, the wire 106, the wire 120, the conductor 107, the conductor 108, the conductor 109, the conductor 111, the conductor 114, the conductor 121, the conductor 124 and the like makes it possible to extract a predetermined signal from a required site from an uppermost portion to a lowermost portion. In the first embodiment, the substrate 110 is of a four-layer wiring structure. However, the wiring layers in the substrate 110 are optional in number. That is, the substrate 110 may be of a five-layer wiring structure or a six-layer wiring structure. The same holds true for subsequent embodiments.

Next, description will be given of a characteristic configuration in the first embodiment of the present invention.

In the first embodiment, the connection terminal 142, the conductor 107, the wire 106 and the conductor 108 connect between the bump electrode 144 and the connection terminal 141. Further, the conductor 109 and the connection terminal 143 connect between the connection terminal 141 and the bump electrode 145. Thus, the connection between the connection terminal 141 and the bump electrode 145 and the connection for inspection between the bump electrode 144 and the connection terminal 141 establish a serial connection between the bump electrode 145 and the bump electrode 144 through the connection terminal 141. This serial connection provides the following advantages. That is, an inspection of continuity between the bump electrode 144 and the bump electrode 145 makes it possible to confirm that there is no problem about the connection between the connection terminal 141 and the bump electrode 145. Further, a tester is connected to the bump electrodes 144 and 145 each serving as an external electrode, without contact between a surface of the connection terminal 141 and a probe. As a result, it is possible to facilitate an inspection of continuity between the connection terminal 141 provided for a connection with the semiconductor device 180 to be stacked and the bump electrode 145.

In a case that a plurality of connection terminals have an identical node such as a power supply at an identical potential, the substrate 110 includes the connection terminal 125, the connection terminal 122, the bump electrode 123, the through conductor 121, the connection terminal 115, the connection terminal 112, the bump electrode 113, the through conductor 111, the conductor 114, the conductor 124 and the wire 120. Herein, the connection terminal 125 is provided for the connection with the semiconductor device 180 to be stacked. The connection terminal 122 is provided for a connection with an external substrate and is formed on the bottom face of the substrate 110 so as to oppose the connection terminal 125. The bump electrode 123 is connected to the connection terminal 122. The through conductor 121 connects between the connection terminal 125 and the connection terminal 122. The connection terminal 115 and the connection terminal 125 are formed on a single plane and are at an identical potential. The connection terminal 112 is formed on the bottom face of the substrate 110. The bump electrode 113 is connected to the connection terminal 112. The through conductor 111 connects between the connection terminal 115 and the connection terminal 112. The conductor 114, the conductor 124 and the wire 120 connect between the connection terminal 125 and the connection terminal 115. Thus, a serial connection is established between the bump electrode 123 and the bump electrode 113 through the connection terminal 125 and the connection terminal 115. This serial connection provides the following advantages. That is, an inspection of continuity between the bump electrode 123 and the bump electrode 113 makes it possible to confirm that there is no problem about the connection between the connection terminal 125 and the bump electrode 123 and the connection between the connection terminal 115 and the bump electrode 113. As a result, it is possible to facilitate an inspection of continuity between the connection terminal 125 provided for the connection with the semiconductor device 180 to be stacked and the bump electrode 123 and an inspection of continuity between the connection terminal 115 and the bump electrode 113, without contact between the surfaces of the connection terminal 125 and the connection terminal 115 and the probe.

As a result, it is unnecessary to perform an inspection in a state that probes are brought into contact with both faces of the substrate 110. Thus, it is possible to reduce cost for an inspection socket and to prevent decrease in yield due to erroneous contact of a probe.

In FIG. 2, the semiconductor chip 100 is mounted on amount region 203. The connection terminal 115, the connection terminal 125, a connection terminal 130, a connection terminal 131 and the connection terminal 141 are provided for the connection with the semiconductor device 180 to be stacked. The wire 132 formed on the first layer of the substrate 110 connects between the connection terminal 130 and the connection terminal 131. The wires 106 and 120 are formed on the third layer of the substrate 110. The conductors 114 and 124 connect between the connection terminals 115 and 125 and the wire 120.

Interconnection using the connection terminal 130, the connection terminal 131 and the wire 132 illustrated in FIG. 2 is different from the interconnection using the conductor 114, the conductor 124 and the wire 120 for the connection between the connection terminal 125 and the connection terminal 115 illustrated in FIG. 1. In the interconnection illustrated in FIG. 2, only the wire 132 formed on the first layer of the substrate 110 connects between the connection terminal 130 and the connection terminal 131; thus, a serial connection similar to that illustrated in FIG. 1 is established. With this interconnection, similarly, it is possible to facilitate an inspection of continuity between a connection terminal formed on a top face of a substrate and a bump electrode formed on a bottom face of the substrate by means of only the bump electrode without contact between the connection terminal and a probe. Further, it is possible to improve reliability of a stacking-type semiconductor module.

In the first embodiment, desirably, the following consideration is made. That is, in order to prevent contact among the conductor 114, the conductor 124, the wire 120, the conductor 121 and the conductor 111, a distance between the adjacent conductors is made longer than a minimum design dimension and a margin is partially increased, so that occurrence of failure is suppressed. The same holds true for subsequent embodiments.

As described above, in a case that a plurality of connection terminals has an identical node such as a power supply or aground at an identical potential, a wire formed on an optional layer of a substrate is used for a connection between the connection terminals. Then, bump electrodes connected to the respective connection terminals and formed on a bottom face of the substrate are brought into contact with a probe, respectively, so that an inspection of continuity between each connection terminal and a bump electrode corresponding to each connection terminal can be performed. Accordingly, it is possible to perform an inspection of continuity by means of only a bump electrode formed on one of faces of a substrate without contact between a connection terminal and a probe. Thus, it is possible to facilitate an inspection of continuity between a connection terminal and a bump electrode, and to improve reliability of a stacking-type semiconductor module.

(Second Embodiment)

With reference to FIGS. 3 and 4, description will be given of a semiconductor integrated circuit in a second embodiment of the present invention. In this embodiment, description will be given of a connection among the plurality of connection terminals described in the first embodiment in order to perform an inspection.

FIG. 3 briefly illustrates a configuration of a substrate in the second embodiment of the present invention when being seen from above. FIG. 4 schematically illustrates a configuration of a connection in the second embodiment of the present invention. Herein, specific description is given with reference to FIG. 4.

In FIG. 3, connection terminals 315, 325 and 345 are provided for a connection with a semiconductor device to be stacked, respectively. A wire 308 connects among the connection terminals 315, 325 and 345, and is formed on an outer periphery of a first layer (a top face) of the substrate so as to surround the substrate.

In FIG. 4, the connection terminals 315, 325 and 345 are provided for the connection with the semiconductor device to be stacked, respectively. The wire 308 connects among the connection terminals 315, 325 and 345, and is formed on the outer periphery of the first layer of the substrate so as to surround the substrate. Connection terminals 412, 422 and 442 are formed on a fourth layer (a bottom face) of the substrate. Bump electrodes 413, 423 and 443 are connected to the connection terminals 412, 422 and 442, respectively.

The wire 308 connects among a plurality of connection terminals at an identical potential, that is, the connection terminals 315, 325 and 345, and secures a conductive path upon performance of an inspection. A wire to be used herein is limited to the wire 308 formed on the first layer of the substrate. In other words, a wire formed on a second layer of the substrate and a wire formed on a third layer of the substrate are not used herein. The connection terminals are connected to each other only by the wire formed on the first layer of the substrate, so that an inspection of continuity can be performed via all target paths without using the wires in the substrate other than the conductive path to be inspected.

Upon performance of an inspection, for example, the bump electrode 423 is used as a reference terminal. First, probes are brought into contact with the bump electrode 423 and the bump electrode 413, so that an inspection of continuity between the connection terminal 315 and the bump electrode 413 is performed. Next, the probes are brought into contact with the bump electrode 423 and the bump electrode 443, so that an inspection of continuity between the connection terminal 345 and the bump electrode 443 is performed. As described above, a connection status between terminals is confirmed successively in such a manner that a terminal provided on one of faces of a substrate is used as a reference terminal.

In addition, when connection terminals on all conductive paths are connected to the wire 308 formed on the first layer of the substrate, an inspection of continuity for all paths to be inspected can be performed in such a manner that one bump electrode selected optionally is used as a reference terminal. Therefore, it is possible to omit a standby time for a change in reference terminal upon performance of an inspection. Further, it is possible to use a simple program for an inspection. This leads to prevention of an erroneous inspection.

As described above, in a case that a plurality of connection terminals have an identical node such as a power supply or a ground at an identical potential, a ring-shaped wire formed on a first layer of a substrate connects among these connection terminals. In this state, optional one of bump electrodes connected to the respective connection terminals and formed on the bottom face of the substrate is used as a reference terminal in order to perform an inspection of continuity between each connection terminal and a bump electrode corresponding to each connection terminal. Thus, it is possible to perform an inspection of continuity between each connection terminal and a bump electrode corresponding to each connection terminal. Therefore, it is possible to perform an inspection of continuity by means of only an optional reference bump electrode selected from bump electrodes provided at one of faces of a substrate, without contact between a connection terminal and a probe. Thus, it is possible to facilitate an inspection of continuity between a connection terminal and a bump electrode, and to improve reliability of a stacking-type semiconductor module.

Further, the ring-shaped wire formed on the first layer of the substrate is also used as an annular wire typically used for suppressing voltage fluctuations between connection terminals having an identical node. Thus, it is possible to suppress an increase in area of a ring-shaped wire for an inspection in the present invention.

(Third Embodiment)

With reference to FIGS. 5 to 7, description will be given of a semiconductor integrated circuit in a third embodiment of the present invention. In this embodiment, description will be given of a connection among connection terminals in a case that the wire formed on the first layer of the substrate described in the second embodiment cannot connect among the connection terminals.

FIG. 5 briefly illustrates a configuration of a substrate in the third embodiment of the present invention when being seen from above. FIG. 6 is a sectional view taken along a line A-A' in FIG. 5 and illustrates the configuration of the substrate in the third embodiment of the present invention. FIG. 7 schematically illustrates a configuration of a connection in the third embodiment of the present invention. Herein, specific description is given with reference to FIG. 7.

In FIG. 5, connection terminals 515, 525 and 345 are provided for a connection with a semiconductor device to be stacked, respectively. A wire 518 connects among the connection terminals 515, 525 and 345, and is formed on an outer periphery of a second layer of a substrate so as to surround the substrate.

In FIG. 6, the connection terminal 515 is provided for the connection with the semiconductor device to be stacked. The wire 518 is formed on the outer periphery of the second layer of the substrate so as to surround the substrate. A conductor 614 connects between the connection terminal 515 and the wire 518. A connection terminal 612 is formed on a fourth layer (a bottom face) of the substrate. A conductor 611 connects between the connection terminal 515 and the connection terminal 612. A bump electrode 613 is connected to the connection terminal 612.

In FIG. 7, the connection terminals 515, 525 and 345 are provided for the connection with the semiconductor device to be stacked, respectively. The wire 518 connects among the connection terminals 515, 525 and 345, and is formed on the outer periphery of the second layer of the substrate so as to surround the substrate. The connection terminal 612, a connection terminal 722 and a connection terminal 742 are formed on the fourth layer of the substrate. The bump electrode 613, a bump electrode 723 and a bump electrode 743 are connected to the connection terminal 612, the connection terminal 722 and the connection terminal 742, respectively.

The wire 518 connects among a plurality of connection terminals at an identical potential, that is, the connection terminals 515, 525 and 345. The third embodiment is different in configuration from the second embodiment. More specifically, in a case that interconnection cannot be achieved only by a wire on a first layer, interconnection is achieved by a wire on a second layer or a wire on a third layer once and, then, is achieved by the wire on the first layer again. Thus, a serial connection among a plurality of connection terminals having an identical node can be established. Herein, the wire 518 suppresses voltage fluctuations of each connection terminal. Further, in a case that a space for interconnection in the second or third layer is wider than that in the first layer, the wire 518 is increased in thickness. Thus, it can be expected that the wire 518 suppresses the voltage fluctuations with more certainty.

Upon performance of an inspection, as in a similar manner to that in the second embodiment, for example, the bump electrode 723 is used as a reference terminal. First, probes are brought into contact with the bump electrode 723 and the bump electrode 613, so that an inspection of continuity between the connection terminal 515 and the bump electrode 613 is performed. Next, the probes are brought into contact with the bump electrode 723 and the bump electrode 743, so that an inspection of continuity between the connection terminal 345 and the bump electrode 743 is performed. As described above, a connection status between connection terminals is confirmed successively in a such a manner that a bump terminal provided at one of faces of a substrate is used as a reference terminal.

As described above, in a case that a plurality of connection terminals have an identical node such as a power supply or a ground at an identical potential, it is difficult to achieve interconnection only by a wire formed on a first layer of a substrate. Therefore, these connection terminals are connected to a ring-shaped wire formed on each wiring layer of the substrate. Then, optional one of bump electrodes connected to the connection terminals and formed on the bottom face of the substrate is used as a reference terminal in order to perform an inspection of continuity between each connection terminal and a bump electrode corresponding to each connection terminal. Accordingly, it is possible to perform an inspection of continuity between each connection terminal and a bump electrode corresponding to each connection terminal. Therefore, it is possible to perform an inspection of continuity by means of only an optional reference bump electrode selected from bump electrodes provided at one of faces of a substrate, without contact between a connection terminal and a probe. Thus, it is possible to facilitate an inspection of continuity between a connection terminal and a bump electrode, and to improve reliability of a stacking-type semiconductor module.

(Fourth Embodiment)

With reference to FIGS. 8 and 9, description will be given of a semiconductor integrated circuit in a fourth embodiment of the present invention. In this embodiment, description will be given of a change in inspection method in the third embodiment in order to facilitate interconnection.

FIG. 8 briefly illustrates a configuration of a substrate in the fourth embodiment of the present invention when being seen from above. FIG. 9 schematically illustrates a configuration of a connection in the fourth embodiment of the present invention. Herein, specific description is given with reference to FIG. 9.

In FIG. 8, connection terminals 815 and 825 are provided for a connection with a semiconductor device to be stacked, respectively. A wire 833 is formed on a second layer of the substrate and a wire 834 is formed on a third layer of the substrate. Each of the wires 833 and 834 is provided for a connection between connection terminals at an identical potential.

In FIG. 9, the connection terminal 815, the connection terminal 825, a connection terminal 945, a connection terminal 955 and a connection terminal 965 are provided for the connection with the semiconductor device to be stacked, respectively. The wire 833 connects between the connection terminal 815 and the connection terminal 945, and is formed on the second layer of the substrate. The wire 834 connects between the connection terminal 955 and the connection terminal 965, and is formed on the third layer of the substrate. Connection terminals 912, 922, 942 and 952 are formed on a fourth layer (a bottom face) of the substrate. Bump electrodes 913, 923, 943 and 953 are connected to the connection terminals 912, 922, 942 and 952, respectively.

The wires 833 and 834 connect among a plurality connection terminals at an identical potential, that is, the connection terminals 815, 825, 945, 955 and 965, and secure conductive paths upon performance of an inspection. Herein, each of the wires 833 and 834 is not formed into a ring shape for connection among all connection terminals at an identical potential. For example, the wire 833 connects between the connection terminal 815 and the connection terminal 945, and the wire 834 connects between the connection terminal 955 and the connection terminal 965. As described above, each wire forms one path.

Upon performance of an inspection, unlike the third embodiment, an inspection of continuity between a connection terminal and a bump electrode on a set of two paths is performed without provision of a reference terminal for inspection. First, probes are brought into contact with the bump electrode 923 and the bump electrode 913, so that an inspection of continuity between the connection terminal 815 and the bump electrode 913 is performed. Next, the probes are brought into contact with the bump electrode 943 and the bump electrode 953, so that an inspection of continuity between the connection terminal 945 and the bump electrode 943 is performed. As described above, each connection status between terminals is inspected independently. It is needless to say that bump electrodes other than a bump electrode to be inspected must be set at an OPEN status, respectively, in order to prevent an erroneous connection inspection through a wiring path which is not subjected to an inspection. As a result, an inspecting process is increased in number. However, it is possible to suppress voltage fluctuations without provision of a ring-shaped wire. Further, it can be expected that wiring is performed efficiently so that interconnection is simplified.

As described above, in a case that a plurality of connection terminals have an identical node such as a power supply or a ground at an identical potential, connections between connection terminals and bump electrodes on two paths are paired, and a wire formed on an optional layer of a substrate connects between the connection terminals. Thus, it is possible to perform an inspection of continuity between each connection terminal and a bump electrode corresponding to each connection terminal by means of a bump electrode provided on the bottom face of the substrate. Therefore, it is possible to perform an inspection of continuity by means of only a bump electrode provided at one of faces of a substrate, without contact between a connection terminal and a probe. Thus, it is possible to facilitate an inspection of continuity between a connection terminal and a bump electrode, and to improve reliability of a stacking-type semiconductor module.

(Fifth Embodiment)

With reference to FIGS. 10 and 11, description will be given of a semiconductor integrated circuit in a fifth embodiment of the present invention. In this embodiment, description will be given of a method for facilitating an inspection between connection terminals based on the first embodiment.

FIG. 10 briefly illustrates a configuration of substrate in the fifth embodiment of the present invention when being seen from above. FIG. 11 schematically illustrates a configuration of a connection in the fifth embodiment of the present invention. Herein, specific description is given with reference to FIG. 11.

In FIG. 10, connection terminals 1015, 1025, 1045, 1055, 1065 and 1075 are provided for a connection with a semiconductor device to be stacked, respectively. Herein, the connection terminal 1015 and the connection terminal 1025 are at an identical potential in a pair. The connection terminal 1045 and the connection terminal 1055 are at an identical potential in a pair. The connection terminal 1065 and the connection terminal 1075 are at an identical potential in a pair. The aforementioned potentials may not be equal to each other. For example, the pair of connection terminals 1015 and 1025 may have an identical power supply, and the pair of connection terminals 1045 and 1055 may have an identical ground. Further, all paths may be connected to each other.

In FIG. 11, the connection terminals 1015, 1025, 1045, 1055, 1065 and 1075 are provided for the connection with the semiconductor device to be stacked, respectively. A wire 1133 connects between the connection terminal 1015 and the connection terminal 1025, and is formed on a first layer (a top face) of the substrate. Connection terminals 1112 and 1122 are formed on a fourth layer (a bottom face) of the substrate. A bump electrode 1113 and a bump electrode 1123 are connected to the connection terminal 1112 and the connection terminal 1122, respectively. Terminals 1190 and 1192 serve as an inspection socket terminal and achieve continuity upon performance of an inspection, respectively. A conductor 1191 connects between connection terminals in a pair on the inspection socket.

In the fifth embodiment, connection terminals at an identical potential, such as the connection terminals 1015 and 1025 or the connection terminals 1045 and 1055, are paired without fail. However, the configuration in the first embodiment that an inspection of continuity can be performed by the bump electrodes 144 and 145 is also regarded as a pair.

An inspection is performed by means of an inspection socket terminal connected with a pair of connection terminals connected to each other through the conductor 1191 or the like. A serial connection between the inspection socket terminal 1190 and the terminal 1192 through the connection terminal 1025, the connection terminal 1015, the connection terminal 1112, the bump electrode 1113, the connection terminal 1045, the connection terminal 1055, the conductor 1191, the connection terminal 1065 and the connection terminal 1075 is established. Thus, an inspection of continuity between the connection terminal 1025 and the bump electrode 1123, an inspection of continuity between the connection terminal 1015 and the bump electrode 1113, an inspection of continuity between the connection terminal 1045 and a bump electrode corresponding to the connection terminal 1045, an inspection of continuity between the connection terminal 1055 and a bump electrode corresponding to the connection terminal 1055, an inspection of continuity between the connection terminal 1065 and a bump electrode corresponding to the connection terminal 1065, and an inspection of continuity between the connection terminal 1075 and a bump electrode corresponding to the connection terminal 1075 can be preformed at once, leading to reduction in inspection time.

As described above, in a case that a plurality of connection terminals have an identical node such as a power supply or a ground at an identical potential, connections between connection terminals and bump electrodes on two paths are paired, a wire formed on a first layer of a substrate connects between the connection terminals, and an inspection socket in which respective terminals are connected each other in such a manner that the respective pairs are connected in series is used. As a result, connection paths between connection terminals having an identical node and bump electrodes corresponding to the respective connection terminals are connected in series upon performance of an inspection. Therefore, an inspection of continuity between bump electrodes at both ends of this serial interconnection makes it possible to perform all inspections of continuity between connection terminals and bump electrodes. Accordingly, it is possible to perform an inspection of continuity by means of only a bump electrode formed on one of faces of a substrate, without contact between a connection terminal and a probe. Thus, it is possible to facilitate an inspection of continuity between a connection terminal and a bump electrode, and to improve reliability of a stacking-type semiconductor module.

What is claimed is:

1. A semiconductor device comprising a multi-layer substrate, which includes a first layer and a second layer physically connected to the first layer, the semiconductor device having a first surface on the first layer and a second surface on the second layer and opposing the first surface, the semiconductor device further comprising:
    a semiconductor chip flip-chip mounted on the first surface;
    a plurality of connection terminals disposed on the first surface, the plurality of connection terminals comprising connection terminals at a central area of the first surface connected to the semiconductor chip and other connection terminals at a peripheral area of the first surface located around the semiconductor chip and being capable of stacking a semiconductor device on the multi-layer substrate, wherein the other connection terminals at the peripheral area include a first connection terminal;
    first and second external electrodes on the second surface of the multi-layer substrate;
    a first via portion connecting the first connection terminal to the first external electrode; and
    a second via portion connecting the first connection terminal to the second external electrode,
    wherein a connection of the first via portion, the first connection terminal, and the second via portion forms a single route electrically between the first external electrode and the second external electrode.

2. A semiconductor device comprising a multi-layer substrate, which includes a first layer and a second layer physically connected to the first layer, the semiconductor device having a first surface on the first layer and a second surface on the second layer and opposing the first surface, the semiconductor device further comprising:
    a semiconductor chip flip-chip mounted on the first surface;
    a plurality of connection terminals disposed on the first surface, the plurality of connection terminals comprising connection terminals at a central area of the first surface connected to the semiconductor chip and other connection terminals at a peripheral area of the first surface located around the semiconductor chip and being capable of stacking a semiconductor device on the multi-layer substrate, wherein the other connection terminals at the peripheral area include a first connection terminal;
    first and second external electrodes on the second surface of the multi-layer substrate;
    a first via portion connecting the first connection terminal to the first external electrode; and
    a second via portion connecting the first connection terminal to the second external electrode,
    wherein a connection of the first via portion, the first connection terminal, and the second via portion forms a single route electrically between the first external electrode and the second external electrode, and
    the first via portion comprising a first via, a first wiring, and a second via disposed on an inner layer of the multi-layer substrate, the first via connects with the first connection terminal, the first wiring connects with the first via, and the second via connects the first wiring to the first external electrode.

3. The semiconductor device according to claim 1, wherein the connection terminals at the peripheral area are arranged in two rows.

4. The semiconductor device according to claim 2, wherein the connection terminals at the peripheral area are arranged in two rows.

5. The semiconductor device according to claim 1, wherein the connection terminals at the peripheral area are arranged in just two rows.

6. The semiconductor device according to claim 2, wherein the connection terminals at the peripheral area are arranged in just two rows.

7. The semiconductor device according to claim 1, wherein the multi-layer substrate has 4 layers, an uppermost layer connect to the connection terminals, and a lower-most layer connect to the external electrodes.

8. The semiconductor device according to claim 2, wherein the multi-layer substrate has 4 layers, an uppermost layer connect to the connection terminals, and a lower-most layer connect to the external electrodes.

9. The semiconductor device according to claim 1, further comprising a plurality of bump electrodes connecting with the external electrodes, respectively.

10. The semiconductor device according to claim 2, further comprising a plurality of bump electrodes connecting with the external electrodes, respectively.

11. The semiconductor device according to claim 1, wherein the first via portion and the second via portion penetrate the plurality of layers in the multi-layer substrate, and electrically connect the first connection terminal to the second external electrode.

12. The semiconductor device according to claim 2, wherein a third via of the second via portion penetrates the plurality of layers in the multi-layer substrate, and electrically connects the first connection terminal to the second external electrode.

13. The semiconductor device according to claim 1, further comprising:
a second connection terminal which is comprised in the connection terminals disposed at the central area and connected to the semiconductor chip;
a third connection terminal which is comprised in the connection terminals disposed at the peripheral area;
a second wiring disposed on an inner layer of the multi-layer substrate;
a via connecting with the second connection terminal and the second wiring in the multi-layer substrate; and
another via connecting with the third connection terminal and the second wiring in the multi-layer substrate.

14. The semiconductor device according to claim 2, further comprising:
a second connection terminal which is comprised in the connection terminals disposed at the central area and connected to the semiconductor chip;
a third connection terminal which is comprised in the connection terminals disposed at the peripheral area;
a second wiring disposed on an inner layer of the multi-layer substrate;
a fourth via connecting with the second connection terminal and the second wiring in the multi-layer substrate; and
a fifth via connecting with the third connection terminal and the second wiring in the multi-layer substrate.

15. The semiconductor device according to claim 1, wherein the connection of the first via portion, the first connection terminal, and the second via portion is electrically independent from any other connection terminals.

16. A semiconductor device comprising a multi-layer substrate having a first surface and a second surface opposing the first surface, the semiconductor device further comprising:
a semiconductor chip flip-chip mounted on the first surface;
a plurality of connection terminals disposed on the first surface, the plurality of connection terminals comprising central connection terminals at a central area of the first surface connected to the semiconductor chip and peripheral connection terminals at a peripheral area of the first surface located around the semiconductor chip and being capable of stacking a semiconductor device on the multi-layer substrate, wherein the peripheral connection terminals include a first connection terminal and a second connection terminal disposed inside the first connection terminal in plan view;
first and second external electrodes on the second surface of the multi-layer substrate;
a first via portion connecting the first connection terminal to the first external electrode; and
a second via portion connecting the first connection terminal to the second external electrode,
wherein a connection of the first via portion, the first connection terminal, and the second via portion forms a single route electrically between the first external electrode and the second external electrode.

17. The semiconductor device according to claim 16, wherein the connection of the first via portion, the first connection terminal, and the second via portion is electrically independent from any other connection terminals.

18. The semiconductor device according to claim 16, wherein the first connection terminal is arranged along at least two side surfaces of the semiconductor chip in plan view, and the second connection terminal is arranged along at least two side surfaces of the semiconductor chip and the first connection terminals in plan view.

19. The semiconductor device according to claim 16, wherein the multi-layer substrate has a first substrate and a second substrate physically connected to the first substrate, and the first surface on the first substrate and the second surface on the second substrate.

20. A semiconductor device comprising a multi-layer substrate having a first surface and a second surface opposing the first surface, the semiconductor device further comprising:
a semiconductor chip flip-chip mounted on the first surface;
a plurality of connection terminals disposed on the first surface, the plurality of connection terminals comprising connection terminals at a central area of the first surface connected to the semiconductor chip and other connection terminals at a peripheral area of the first surface located around the semiconductor chip and being capable of stacking a semiconductor device on the multi-layer substrate, wherein the other connection terminals at the peripheral area include a first connection terminal;
first and second external electrodes on the second surface of the multi-layer substrate;
a first wiring disposed on an inner layer of the multi-layer substrate;
a first via connecting the first connection terminal to the first wiring;

a second via connecting the first wiring to the first external electrode; and a third via penetrating the plurality layers in the multi-layer substrate and electrically connecting the first connection terminal to the second external electrode, wherein a connection of the first via, the first wiring, the second via, the first connection terminal, and the third via forms a single route electrically between the first external electrode and the second external electrode.

21. The semiconductor device according to claim 1, wherein the first via portion comprises a first via, a first wiring disposed on an inner layer of the multi-layer substrate, and a second via.

* * * * *